United States Patent [19]

Hirai et al.

[11] Patent Number: 5,295,778
[45] Date of Patent: Mar. 22, 1994

[54] ASSEMBLING APPARATUS

[75] Inventors: Hiroyuki Hirai, Habikino; Kuninori Takezawa, Kofu; Keiichi Jin, Yamanashi, all of Japan

[73] Assignee: Matsushita Electric Industrial Co., Ltd., Osaka, Japan

[21] Appl. No.: 857,869

[22] Filed: Mar. 26, 1992

[30] Foreign Application Priority Data

Mar. 27, 1991 [JP] Japan .................................. 3-62863

[51] Int. Cl.$^5$ ............................................. B25J 9/00
[52] U.S. Cl. .................................... 414/225; 221/25
[58] Field of Search .................. 414/225, 223, 226; 901/6; 221/25

[56] References Cited

U.S. PATENT DOCUMENTS

| | | |
|---|---|---|
| 4,494,902 | 1/1985 | Kuppens et al. ............... 221/25 X |
| 4,607,761 | 8/1986 | Wright et al. ..................... 221/25 |
| 4,735,341 | 4/1988 | Hamilton et al. ............. 221/25 X |
| 4,810,154 | 3/1989 | Klemmer et al. ........... 414/223 X |
| 4,934,891 | 6/1990 | Hawkswell ..................... 414/223 |
| 5,102,008 | 4/1992 | Kaufman et al. .................. 221/25 |

*Primary Examiner*—Michael S. Huppert
*Assistant Examiner*—Donald W. Underwood
*Attorney, Agent, or Firm*—Wenderoth, Lind & Ponack

[57] ABSTRACT

An assembling apparatus includes a space-saving parts cassette serving as a parts supply member provided in a parts supply section. A parts accommodating member comprises an injection-molded connecting member and a package. The parts accommodating member is capable of holding not only parts of a simple configuration, but also parts of a complicated configuration, with a high accuracy, whereby the parts cassette can be repeatedly used.

2 Claims, 6 Drawing Sheets

ASSEMBLING APPARATUS

FIELD OF THE INVENTION

The present invention relates to an assembling apparatus for mounting parts, such as electronic parts or mechanical parts, on a workpiece.

DESCRIPTION OF THE RELATED ART

In recent years, there is a growing demand for increasing the installation efficiency of a parts feeder of an assembling apparatus for mounting parts, such as electronic parts, or mechanical parts on a workpiece when a plurality of parts are supplied to the workpiece.

An example of a conventional assembling apparatus of this kind is described with reference to FIG. 8. The apparatus comprises a conveyor 40, a frame 42 provided on one side of the conveyor 40, a parts feeder 41 installed on the frame 42, a frame 44 provided on the other side of the conveyor 40 and an assembling robot 43 installed on the frame 44. A workpiece 45 fed by the conveyor 40 is held by the conveyor 40 at a predetermined position thereof. The robot 43 grips parts (not shown) supplied from the parts feeder 41 by means of a tool 46 mounted on the lower end thereof, thus mounting the parts on the workpiece 45.

According to the conventional assembling apparatus, the parts feeder 41 serving as a parts supply section of the apparatus occupies a considerably great space in the apparatus. The parts feeder 41 supplies only one kind of parts. Therefore, if a plurality of parts are to be supplied to the workpiece 45 at the same place, it is necessary that the number of parts feeders 41 is equal to the number of kinds of parts. Accordingly, the parts feeders 41 occupy a large area in the apparatus.

SUMMARY OF THE INVENTION

It is an essential object of the present invention to provide an assembling apparatus including a space-saving parts cassette serving as a parts supply member provided in a parts supply section.

In accomplishing this and other objects of the present invention, there is provided an assembling apparatus comprising: a plurality of packages each having a concave for accommodating parts. Parts accommodating members are connected linearly with each other by a flexible connecting member removable from the packages. A driving section is capable of feeding the parts accommodating members at regular pitches. A parts supply member has the function of collecting the parts accommodating member, and an assembling robot has a tool for, gripping parts supplied from the parts supply member. A means for feeding a workpiece is provided.

According to the above construction, the parts accommodating member comprises an injection-molded connecting member and package. Therefore, the parts accommodating member is capable of holding not only parts of a simple configuration, but also parts of a complicated configuration with a high accuracy. Since a parts cassette, serving as the parts supply member, has the structure of collecting the parts accommodating member, the parts cassette can be used repeatedly. In addition, since the parts cassette is compact, a plurality of parts can be sequentially supplied at the same position by arranging a plurality of parts cassettes in parallel with each other.

BRIEF DESCRIPTION OF THE DRAWINGS

The above and other objects and features of the present invention will become apparent from the following description taken in conjunction with the preferred embodiments thereof with reference to the accompanying drawings, in which.

DETAILED DESCRIPTION OF THE INVENTION

Figure 1:
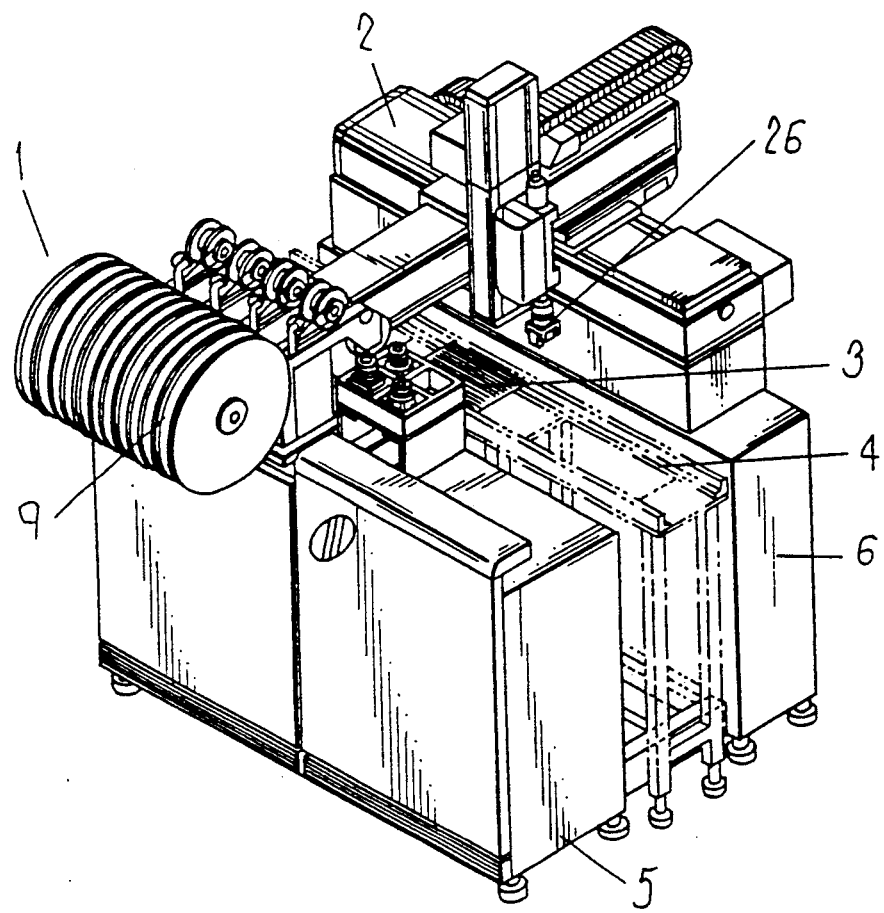
FIG. 1 is a perspective view showing an assembling apparatus according to a first embodiment of the present invention.

Before the description of the present invention proceeds, it is to be noted that like parts are designated by like reference numerals throughout the accompanying drawings.

Referring to FIGS. 1 through 6, an assembling apparatus according to a first embodiment of the present invention will be described below. The apparatus comprises a plurality of parts supply members 1 arranged in parallel with each other. An assembling robot 2, using a rectangular coordinate system, is opposite to the parts supply member 1. A conveyor 4 is positioned between the parts supply member 1 and the robot 2 for transporting a workpiece 3. A movable frame 5 carries the parts supply member 1 and is provided on one side of the conveyor 4. A movable frame 6 carrying the robot 2 is provided on the other side of the conveyor 4.

Figure 2:
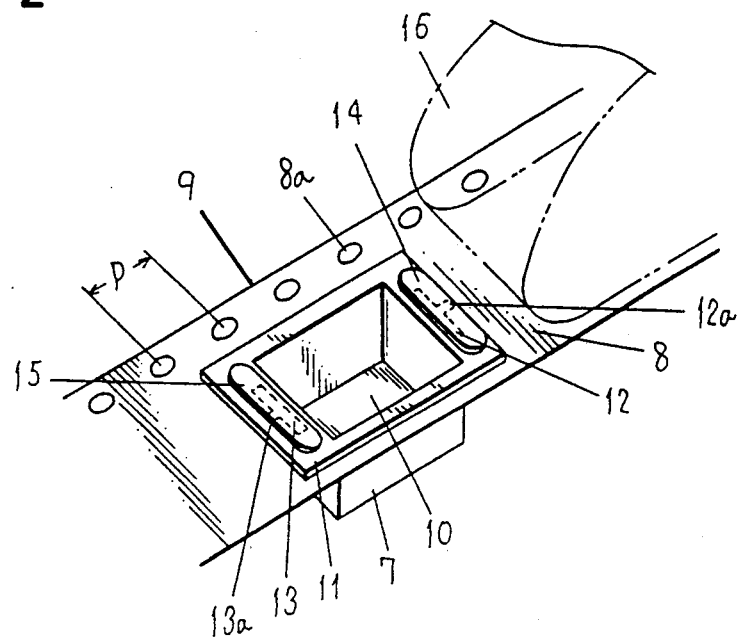
FIG. 2 is schematic perspective view showing a parts accommodating member of the assembling apparatus of FIG. 1.
Figure 3:
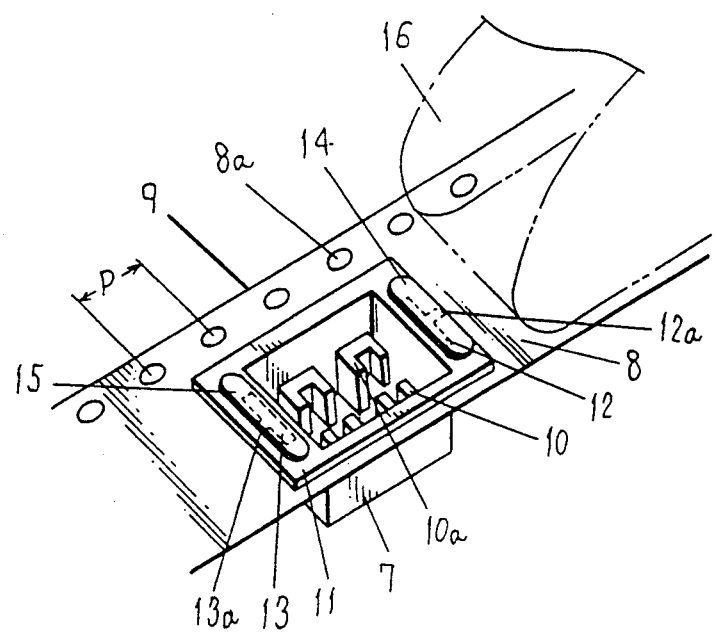
FIG. 3 is schematic perspective view showing the parts accommodating member of the assembling apparatus of FIG. 1 in which a concave portion conforms to the configuration of parts.

Referring to FIGS. 2 and 3, the parts supply member has a package 7, consisting of a hard synthetic resin, and a parts accommodating member 9 comprising a flexible carrier tape 8, consisting of a synthetic resin, for linearly connecting a plurality of the packages 7. The package 7, which is a thick molded product, comprises a concave 10 for accommodating mechanical parts (not shown) and a flange 11 formed on the edge of the concave 10. Resin is introduced into the concave 10 through a through-hole 12 and a slit 12a both positioned on the supporting side of the carrier tape 8, and a through-hole 13 and a slit 13a both positioned on tee movable side of the carrier tape 8. Thus, a fixing section 14 is formed on the supporting side of the package 7 and a fixing section 15 is formed on the movable side of the package 7. The package 7 and the carrier tape 8 are connected with each other in such a manner that the flange 11, the fixing section 14, and the fixing section 15 sandwich the carrier tape 8.

As shown in FIG. 3, the concave 10 has a parts gripping section 10a formed therein according to the configuration of the parts. That is, the parts gripping section 10a can be injection-molded into a desired configuration.

The packages 7 are mounted on the carrier tape 8 at predetermined pitches. The carrier tape 8 has feeding openings 8a formed on both edges thereof at predetermined pitches (P) and a cover tape 16, the width of which is smaller than that of the carrier tape 8 and greater than that of the through-holes 12 and 13 of the package 7.

Figure 4:
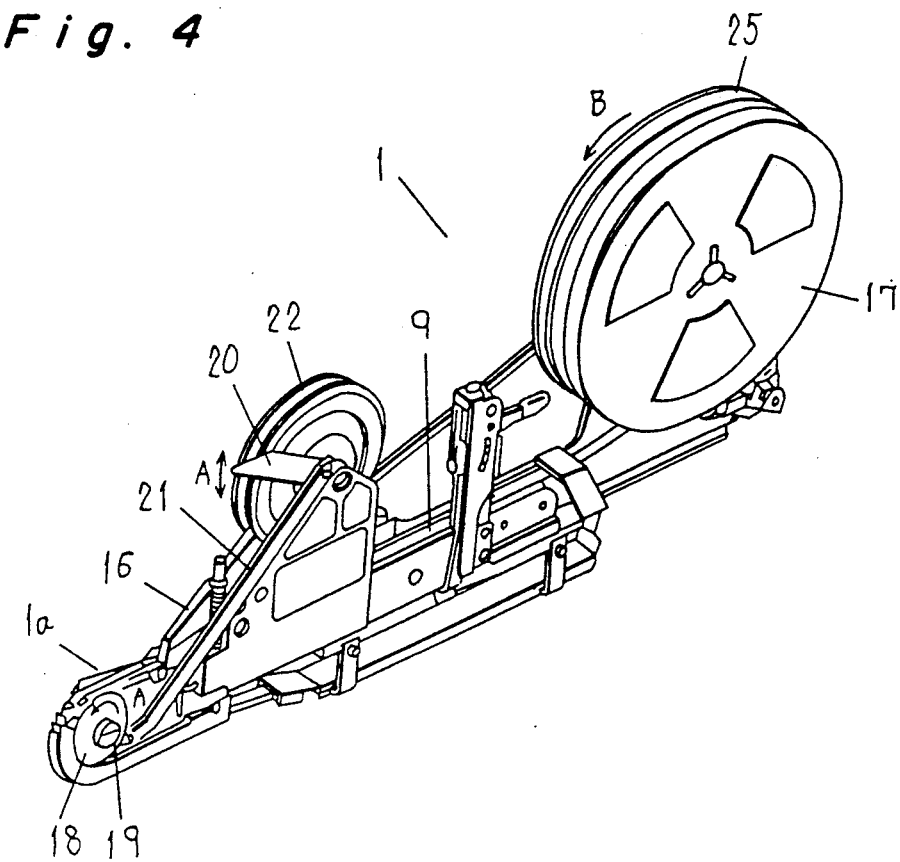
FIG. 4 is a perspective view showing a parts supply member of the assembling apparatus of FIG. 1.

Mechanical parts are supplied to the workpiece 3 by the parts supply member 1 as shown in FIG. 4 by using the parts accommodating member 9 as in the following procedure.

The parts accommodating member 9, wound around a supply reel 17, is fed out therefrom by a driving section comprising a wheel 18 driven by a ratchet 19, which is operated by a lever 20, and a link 21 connecting the lever 20 the ratchet 19 at the predetermined pitches (P). The cover tape 16 for holding parts (not shown) in the parts accommodating member 9 is separated from the parts accommodating member 9 by a cover-collecting reel 22 immediately before the parts pass the wheel 18 so that the parts do not fall out from the parts accommodating member 9. Then, the parts are taken out from the parts accommodating member 9 at take-out opening 1a.

Figure 5:
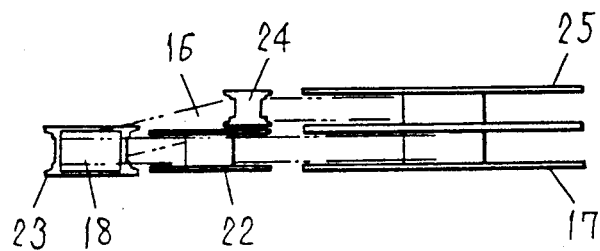
FIG. 5 is a plan view showing the state in which parts are supplied and collected by the parts supply member of FIG. 4.
Figure 6:
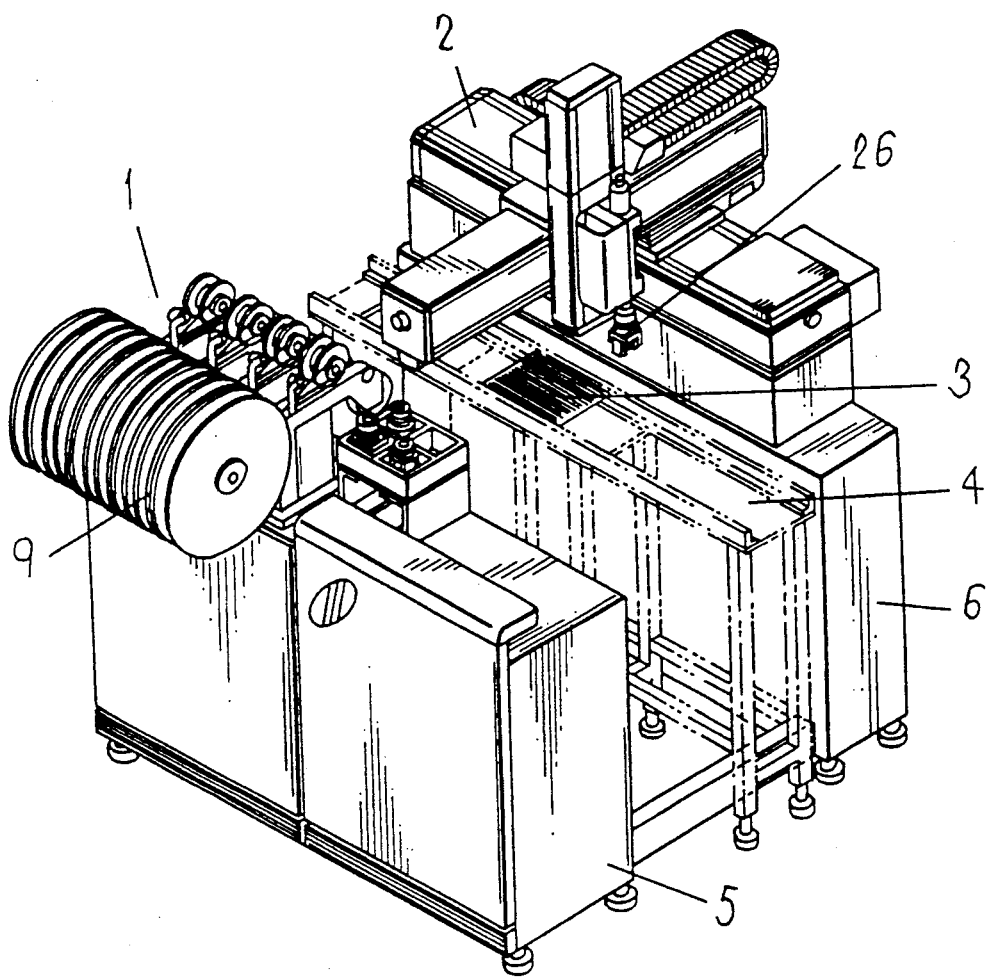
FIG. 6 is a perspective view showing the assembling apparatus of FIG. 1 in which bases are apart from each other.

A guide roller 23 as shown in FIG. 5 regulates the winding angle and position of the parts accommodating member 9 immediately after the parts accommodating member 9 passes the wheel 18 so that the parts accommodating member 9 is not wound loosely around the wheel 18. Even though parts accommodated in the parts accommodating member 9 are large and consequently the pitch (P) becomes great, the packages 7 adjacent to each other in the parts accommodating member 9 can be prevented from interfering with each other.

After the parts accommodating member 9 passes the guide roller 23, the parts accommodating member 9 is wound around a collecting reel 25, guided by a guide roller 24. The parts accommodating member 9 wound around the collecting reel 25 can accommodate parts again, and then these further parts can be supplied to the robot 2 according to the above-described procedure. Reel 25 is mounted noting FIG. 4, adjacent supply reel 17.

Parts are sequentially supplied from a take-out opening la of the supply member 1 to the robot 2, and then gripped by a tool 26 mounted on the lower end of the robot 2. Then the parts are mounted on the workpiece 3 fed by the conveyor 4 traveling between the robot 2 and the parts supply member 1.

If the workpiece 3 is large, the frame 5 and the frame 6 are moved away from each other so that a larger conveyor 4 can be used.

Figure 7:
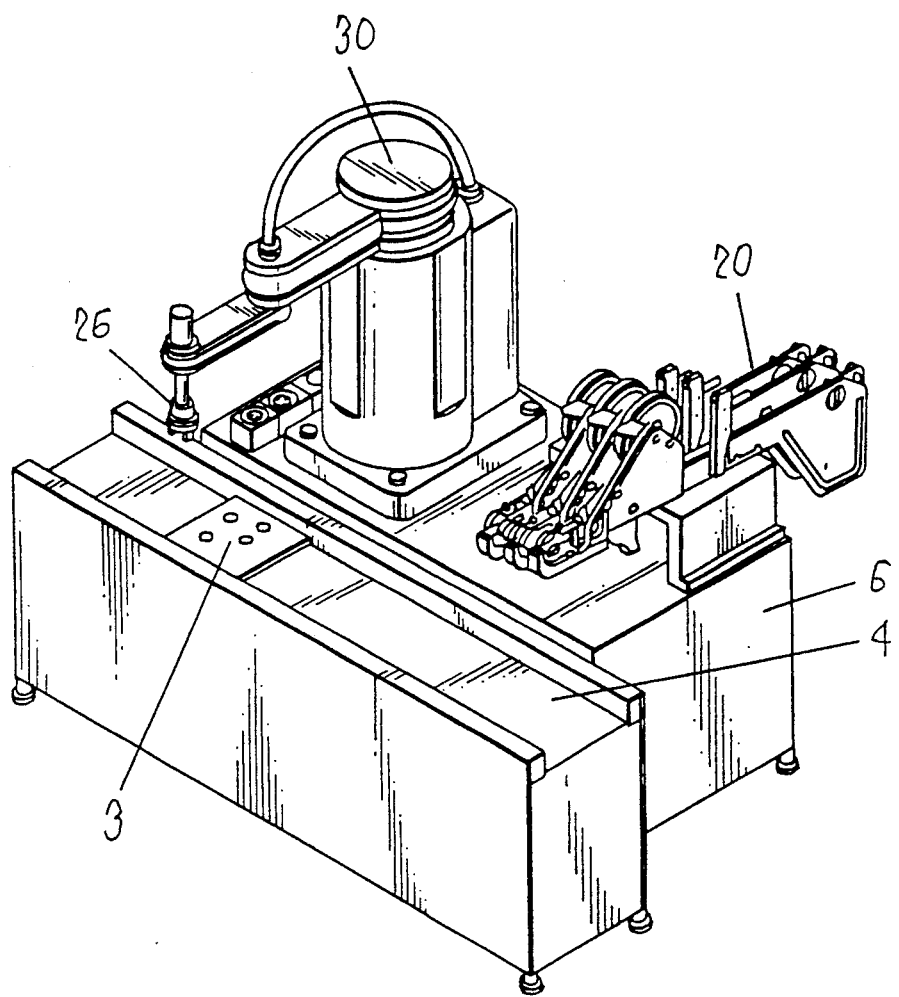
FIG. 7 is a perspective view showing an assembling apparatus according to a second embodiment of the present invention.
Figure 8:
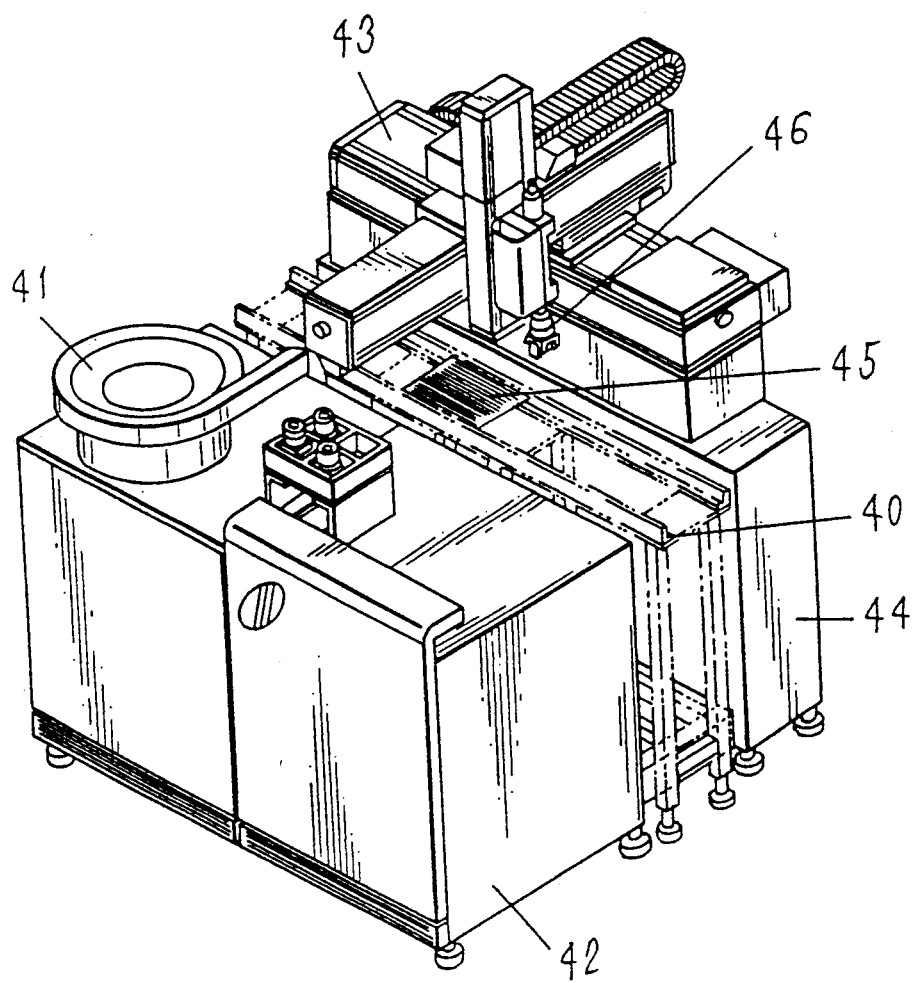
FIG. 8 is a perspective view showing a conventional assembling apparatus.

A second embodiment of the present invention is described below with reference to FIG. 7. According to the second embodiment, an assembling apparats is provided on one side of the conveyor 4.

A scalar type robot 30 and the parts supply member 1 are provided on the frame 6, which is positioned on one side of the conveyor 4. The operation and effect of the second embodiment are similar to those of the first embodiment.

According to the present invention, parts cassettes serving as the parts supply member are provided. Therefore, a plurality of parts can be supplied in a small space and the installation efficiency can be improved. In addition, various kinds of mechanical parts can be supplied to a workpiece because of the use of the parts accommodating members connected linearly with each other by the flexible connecting member removable from a plurality of packages each having a concave for accommodating parts.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A parts assembly apparatus, comprising:
    a parts accommodating member, comprising a flexible carrier tape having a plurality of packages thereon, each said package defining a concave portion for holding a part therein;
    a supply reel having said parts accommodating member wound thereon;
    a driving means feeding said parts accommodating member from said supply reel to a point whereat parts can be removed from said parts accommodating member;
    a collecting reel winding said parts accommodating member thereon after parts have been removed therefrom, said collecting reel being disposed adjacent to said supply reel;
    an assembly robot having a gripping tool for gripping parts supplied by said parts accommodating member at said point and mounting the parts on a workpiece; and
    means for feeding a workpiece to said assembly robot;
    wherein said supply reel and said collecting reel are coaxial and adjacent, and guide rollers are provided guiding said parts accommodating member between said driving means and said collecting reel.

2. The parts assembly apparatus of claim 1, wherein said parts accommodating member has a cover tape on said flexible carrier tape covering said concave portions of said packages, and wherein said cover tape is wound onto a cover tape collecting reel disposed between said supply reel and said point.

* * * * *